United States Patent
Xiong et al.

(10) Patent No.: US 11,621,728 B2
(45) Date of Patent: Apr. 4, 2023

(54) CONCATENATED ERROR CORRECTING CODES

(71) Applicant: Innogrit Technologies Co., Ltd., Shanghai (CN)

(72) Inventors: Chenrong Xiong, San Jose, CA (US); Jie Chen, Milpitas, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/335,640

(22) Filed: Jun. 1, 2021

(65) Prior Publication Data

US 2022/0385309 A1    Dec. 1, 2022

(51) Int. Cl.
| | |
|---|---|
| *H03M 13/00* | (2006.01) |
| *H03M 13/31* | (2006.01) |
| *H03M 13/15* | (2006.01) |
| *H03M 13/11* | (2006.01) |
| *H03M 13/43* | (2006.01) |

(52) U.S. Cl.
CPC ... *H03M 13/6513* (2013.01); *H03M 13/1128* (2013.01); *H03M 13/1131* (2013.01); *H03M 13/152* (2013.01); *H03M 13/1575* (2013.01); *H03M 13/31* (2013.01); *H03M 13/43* (2013.01); *H03M 13/6511* (2013.01)

(58) Field of Classification Search
CPC ................ H03M 13/6513; H03M 13/6511
See application file for complete search history.

(56) References Cited

U.S. PATENT DOCUMENTS

| | | | | |
|---|---|---|---|---|
| 2014/0068379 A1* | 3/2014 | Sakaue | ............... | G06F 11/1012 714/764 |
| 2015/0249471 A1* | 9/2015 | Yen | ................... | H03M 13/6502 714/755 |
| 2018/0175882 A1* | 6/2018 | Hanham | ............ | H03M 13/1111 |
| 2018/0175885 A1* | 6/2018 | Hanham | ........... | H03M 13/2927 |
| 2020/0136644 A1* | 4/2020 | Zeng | ....................... | G11C 29/52 |

(Continued)

OTHER PUBLICATIONS

Chen Z et. al. "A low complexity LDPC-BCH concatenated decoder for NAND flash memory", IEICE Electronics Express, vol. 15, No. 11, 1 11, May 17, 2018.

(Continued)

*Primary Examiner* — Joseph D Torres
(74) *Attorney, Agent, or Firm* — IPRO, PLLC

(57) ABSTRACT

Systems and methods are provided for concatenated error-correcting coding. An apparatus may include a Low-Density Parity-Check (LDPC) decoder configured to perform an iterative LDPC decoding process on bits of an LDPC codeword, a Bose—Chaudhuri—Hocquenghem (BCH) decoder coupled to the LDPC decoder and a BCH scheduler coupled to the LDPC decoder and the BCH decoder. The LDPC codeword may be generated by LDPC encoding a Bose—Chaudhuri—Hocquenghem (BCH) codeword and the BCH codeword may be generated by BCH encoding a data unit. The BCH scheduler may be configured to determine whether a triggering condition for the BCH decoder is met after each iteration of the iterative LDPC decoding process and activate the BCH decoder to operate on an intermediate decoding result of the LDPC decoder if the triggering condition for the BCH decoder is met.

10 Claims, 5 Drawing Sheets

(56) References Cited

U.S. PATENT DOCUMENTS

2020/0366317 A1\* 11/2020 Myung .............. H03M 13/1111
2021/0328602 A1\* 10/2021 Yoshida .............. H03M 13/152

OTHER PUBLICATIONS

Chen P et. al. "BCH Code Selection and Iterative Decoding for BCH and LDPC Concatenated Coding System", IEEE Communications Letters, vol. 17, No. 5, May 2013.
Shieh sl, "Concatenated BCH and LDPC Coding Scheme With Iterative Decoding Algorithm for Flash Memory", IEEE Communications Letters, vol. 19, No. 3, Mar. 2015.

\* cited by examiner

CONCATENATED ERROR CORRECTING CODES

TECHNICAL FIELD

The disclosure herein relates to protecting data from corruption using parity check data, particularly relates to protecting data using concatenated error-correcting codes.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC) code. ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, Low-Density Parity-Check (LDPC) codes have become widely used because of their superior error correction capability. However, LDPC codes have a well-known problem of error floor. One way to lower the error floor of an LDPC code is to minimize the number of harmful graph patterns in the parity-check matrix (for example: trapping sets, stopping sets, absorbing sets) which cause error floor. Moreover, Quasi-Cyclic (QC) LDPC codes are used because the quasi-cyclic property makes the hardware implementation easier. But error floor is hard to get rid of by code construction and the convergence speed of an LDPC decoder has a huge impact on the system throughput.

SUMMARY

The systems and methods of this disclosure provide a new ECC scheme to lower the error floor of Low-Density Parity-Check (LDPC) codes (e.g., Quasi-Cyclic (QC) LDPC codes) and improve the convergence speed of LDPC decoder. The encoding scheme may include concatenation of Bose—Chaudhuri—Hocquenghem (BCH) code and QC-LDPC code, and encoded codewords may be decoded by an iterative concatenated decoding process that involves both the LDPC decoder and the BCH decoder. In various embodiments, after each iteration of an iterative LDPC decoding process, a BCH scheduler may be used to decide whether the BCH decoder may be activated to work on an intermediate decoding result of the LDPC decoder. The BCH decoder decoding result may be fed back to the LDPC decoder for the next LDPC decoding iteration.

In some embodiments, the BCH decoder may be configured to perform BCH decoding. In some other embodiments, the BCH decoder may be simplified to a syndrome calculator to calculate BCH syndromes for BCH error detection. The concatenated ECC scheme may lower error floor of any LDPC decoding algorithm and be used to speed up the convergence of any LDPC decoding algorithm (e.g., BP, min-sum, BF and others). In at least one embodiment, the concatenated ECC scheme be implemented in a solid-state drive (SSD) controller.

In an exemplary embodiment, there is provided a method that may comprise reading bits of a Low-Density Parity-Check (LDPC) codeword from a non-volatile storage device, feeding the bits of the LDPC codeword read from the non-volatile storage device to an LDPC decoder, and performing an iterative concatenated decoding process on the LDPC codeword by inserting one or more Bose—Chaudhuri—Hocquenghem (BCH) decoding processes in an iterative LDPC decoding process. The LDPC codeword may be generated by LDPC encoding a BCH codeword, and the BCH codeword may be generated by BCH encoding a data unit. An iteration of the iterative concatenated decoding process may include: performing an LDPC decoding iteration of the iterative LDPC decoding process on the LDPC codeword to generate an intermediate LDPC decoding result, determining an LDPC syndrome of the intermediate LDPC decoding result has not reached zero, determining whether a triggering condition for BCH decoding is met using a BCH scheduler, performing a BCH decoding process on the intermediate LDPC decoding result when the triggering condition for BCH decoding is met and performing a next iteration in the iterative concatenated decoding process when the triggering condition for BCH decoding is not met or the BCH decoding process is performed but does not successfully decode the BCH codeword.

In another exemplary embodiment, there is provided another method that may comprise: reading bits of a Low-Density Parity-Check (LDPC) codeword from a non-volatile storage device, feeding the bits of the LDPC codeword read from the non-volatile storage device to an LDPC decoder and performing an iterative concatenated decoding process on the LDPC codeword by inserting one or more Bose—Chaudhuri—Hocquenghem (BCH) syndrome calculation processes in an iterative LDPC decoding process. The LDPC codeword may be generated by LDPC encoding a BCH codeword, and the BCH codeword may be generated by BCH encoding a data unit. An iteration of the iterative concatenated decoding process may include: performing an LDPC decoding iteration of the iterative LDPC decoding process on the LDPC codeword to generate an intermediate LDPC decoding result, determining an LDPC syndrome of the intermediate LDPC decoding result has not reached zero, determining whether a triggering condition for BCH syndrome calculation is met using a BCH scheduler, calculating BCH syndromes for BCH error detection on the intermediate LDPC decoding result when the triggering condition for BCH syndrome calculation is met, and performing a next iteration in the iterative concatenated decoding process when the triggering condition for BCH syndrome calculation is not met or the BCH syndromes have not reached zero.

In yet another exemplary embodiment, there is provided an apparatus that may comprise: a Low-Density Parity-Check (LDPC) decoder configured to perform an iterative LDPC decoding process on bits of an LDPC codeword, a Bose—Chaudhuri—Hocquenghem (BCH) decoder coupled to the LDPC decoder, and a BCH scheduler coupled to the LDPC decoder and the BCH decoder. The LDPC codeword may be generated by LDPC encoding a Bose—Chaudhuri—Hocquenghem (BCH) codeword, and the BCH codeword may be generated by BCH encoding a data unit. The BCH scheduler may be configured to determine whether a triggering condition for the BCH decoder is met after each iteration of the iterative LDPC decoding process and activate the BCH decoder to operate on an intermediate decoding result of the LDPC decoder if the triggering condition for the BCH decoder is met.

DETAILED DESCRIPTION

Figure 1:
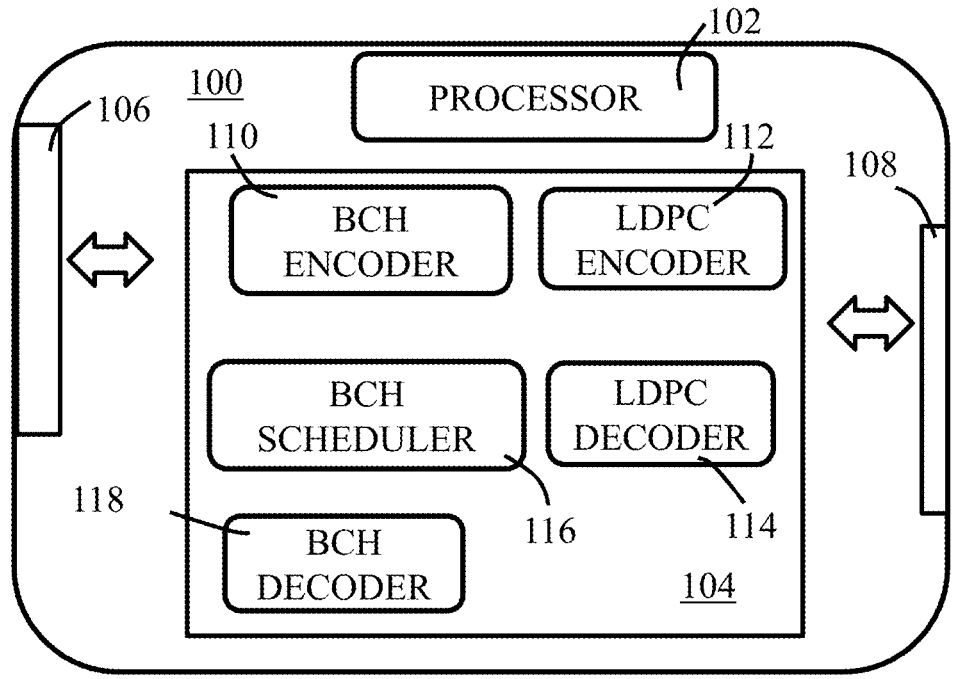
FIG. 1 schematically shows a non-volatile storage controller in accordance with an embodiment of the present disclosure.

Specific embodiments according to the present disclosure will now be described in detail with reference to the accompanying figures. Like elements in the various figures are denoted by like reference numerals for consistency.

FIG. 1 schematically shows a non-volatile storage controller 100 in accordance with an embodiment of the present disclosure. The non-volatile storage controller 100 may comprise a processor 102, an ECC engine 104, a first interface 106 and a second interface 108. The first interface 106 may be any existing or yet to be developed interface that is configured to couple the non-volatile storage controller 100 to a system bus of a host computing system, and receive data from and transmit data to the host computing system. In one embodiment, for example, the first interface 106 may be a Peripheral Component Interconnect Express (PCIS) interface. The second interface 108 may be any existing or yet to be developed interface that is configured to couple the storage controller 100 to one or more non-volatile storage memory (NVM) devices. In one embodiment, the second interface 108 may be a multi-channel interface that may be configured to transfer encoded data (e.g., ECC codewords) over multiple channels in parallel. For example, the second interface 108 may be an Open NAND Flash Interface (ONFI) that may support different protocols (e.g., Non-volatile Double Data Rate (NVDDR), NVDDR Type 2 (NVDDR2), NVDDR Type Three (NVDDR3)), or may be Toggle protocols and run at different transfer speeds.

The processor 102 may be a microcontroller unit (MCU) configured to execute executable instructions (e.g., software or firmware). In various embodiments, the processor 102 may be a microprocessor, a microcontroller, a field-programmable gate array (FPGA), or an application-specific IC (ASIC). The non-volatile storage controller 100 may receive commands from the host via the first interface 106, for example, to store data to the non-volatile storage system (e.g., a write command) or to read data stored in the non-volatile storage system (e.g., a read command).

The ECC engine 104 may comprise encoders for performing BCH encoding and LDPC encoding, such as the BCH encoder 110 and the LDPC encoder 112. The ECC engine 104 may also comprise decoders, such as the BCH decoder 118 and the LDPC decoder 114. The LDPC decoder 114 may be configured to perform an iterative LDPC decoding process, such as, but not limited to, a bit-flipping, or a message passing algorithm (MPA) (e.g., sum-product algorithm ("SPA"), min-sum algorithm, stochastic decoding algorithm). In some embodiments, Quasi-Cyclic (QC) LDPC codes may be used for LDPC encoding.

The ECC engine 104 may further comprise a BCH scheduler 116 coupled to the LDPC decoder 114 and the BCH decoder 118. After each iteration of the LDPC decoding process, some information of the LDPC decoding process may be passed from the LDPC decoder 114 to the BCH scheduler 116. Inputs to the BCH scheduler may include one or more of: an LDPC iteration number, an LDPC column index, an LDPC layer index, the LDPC syndrome, a number of flipped bits in the LDPC decoding iteration, and a number of flipped bits in a previous LDPC decoding iteration.

The ECC engine 104 may be configured to perform an iterative concatenated decoding process by inserting one or more BCH decoding processes (or BCH syndrome calculation processes) in the iterative LDPC decoding process. In some embodiments, an iteration of the iterative concatenated decoding process may include performing an LDPC decoding iteration of the iterative LDPC decoding process on the LDPC codeword to generate an intermediate LDPC decoding result, determining an LDPC syndrome of the intermediate LDPC decoding result has not reached zero, determining whether a triggering condition for BCH decoding (or BCH syndrome calculation) is met using the BCH scheduler 116, activating the BCH decoder 118 when the triggering condition for BCH decoding (or BCH syndrome calculation) is met, and performing a next iteration in the iterative concatenated decoding process when the triggering condition for BCH decoding (or BCH syndrome calculation) is not met, or although the BCH decoder 118 is activated, a BCH decoding by the BCH decoder 118 is not successful or a BCH error detection reports error(s). If the BCH decoding is performed, the BCH decoding result may be fed back from the BCH decoder 118 to the LDPC decoder 114.

In some embodiments, the BCH decoder 118 may be simplified to a BCH syndrome calculator for BCH error detection instead of a full version BCH decoder for BCH decoding. In these embodiments, the triggering condition for BCH decoding may be replaced by triggering condition for BCH syndrome calculation. In either case, the triggering condition may be referred to as the triggering condition for activating the BCH decoder 118 or the triggering condition for the BCH decoder 118. In one embodiment, the trigger condition for the BCH decoder 118 may be that the number of flipped bits in the current LDPC iteration is zero and the LDPC syndrome is larger than zero. In another embodiment, the trigger condition for the BCH decoder 118 may be that the LDPC syndrome is smaller than a predefined threshold (e.g., 64). In yet another embodiment, the trigger condition for the BCH decoder 118 may be that the number of flipped bits in the current LDPC iteration and the number of flipped bits in the previous LDPC iteration are both smaller than a threshold. In a further embodiment, the trigger condition for the BCH decoder 118 may be that the current LDPC iteration number is not smaller than a predefined threshold.

Figure 2:
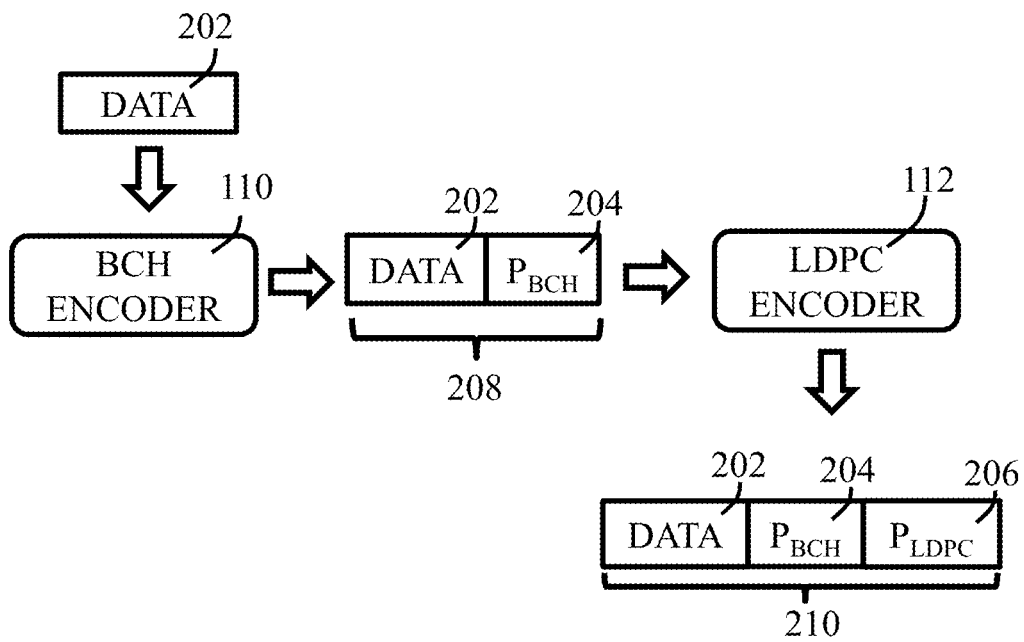
FIG. 2 schematically shows an encoding data path in accordance with an embodiment of the present disclosure.

FIG. 2 schematically shows an encoding data path in accordance with an embodiment of the present disclosure. Data to be protected by the concatenated ECC scheme, for example, a data unit 202, may be encoded by the BCH encoder 110. A BCH codeword 208 may be generated by the BCH encoder 110, which may include the data unit 202 and a BCH parity unit 204. The BCH codeword 208 may then be encoded by the LDPC encoder 112. An LDPC codeword 210 may be generated by the LDPC encoder 112. The LDPC codeword 210 may include the data unit 202, the BCH parity unit 204 and an LDPC parity unit 206. The LDPC codeword 210 may be stored in a non-volatile storage device, for example, a non-volatile memory (NVM) device. In some embodiments, one LDPC codeword may be generated by LDPC encoding more than one BCH codewords. Moreover, in some embodiments, one LDPC codeword may be scattered to be stored across multiple dies of an NVM device or multiple NVM devices.

Figure 3:
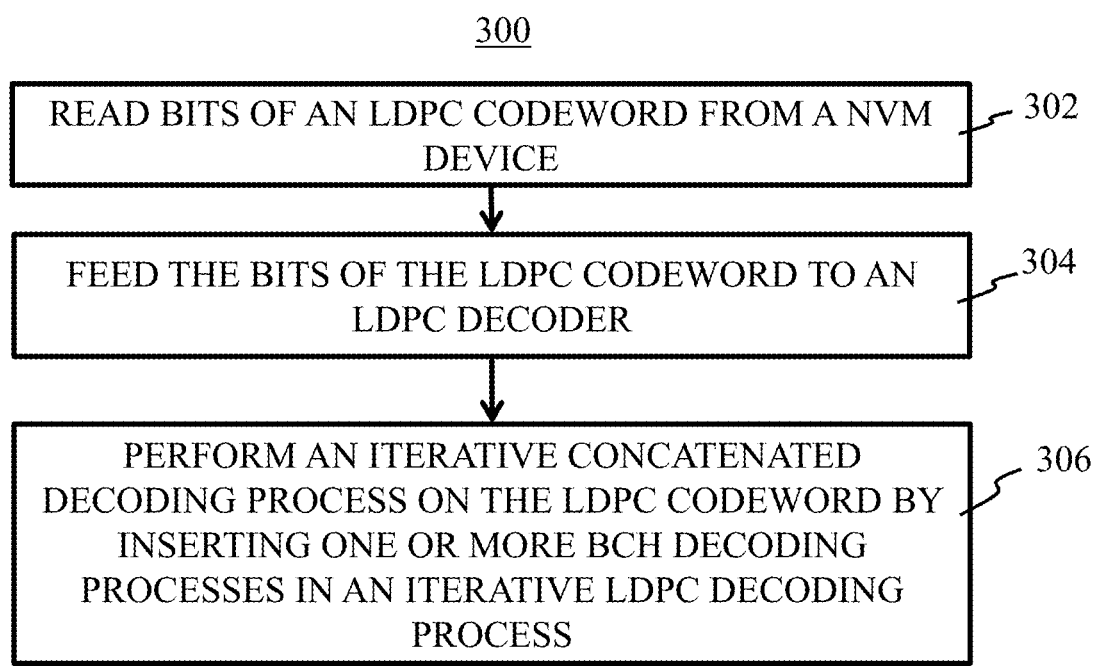
FIG. 3 is a flow diagram of a process for performing concatenated ECC in accordance with an embodiment of the present disclosure.

FIG. 3 is a flow diagram of a process 300 for performing a concatenated ECC decoding in accordance with an embodiment of the present disclosure. In block 302, bits of a Low-Density Parity-Check (LDPC) codeword may be read from a non-volatile storage device. These bits may contain errors and may be referred to as the raw bits. The LDPC codeword may be generated by LDPC encoding a Bose—Chaudhuri—Hocquenghem (BCH) codeword, and the BCH codeword may be generated by BCH encoding a data unit. In some embodiments, more than one BCH codewords may be encoded together by LDPC encoding to generate one LDPC codeword. In block 304, the bits of the LDPC codeword read from the non-volatile storage device may be fed to an LDPC decoder. For example, the LDPC decoder 114 may be fed the raw bits read from an NVM and start the LDPC decoding on these bits read from the NVM. In block 306, an iterative concatenated decoding process may be performed on the LDPC codeword. The LDPC decoder 114 may be configured to perform an iterative LDPC decoding process and one or more BCH decoding processes may be inserted into the iterative LDPC decoding process. In some embodiments that the BCH decoder 118 may be a full-fledged BCH decoder and the BCH decoding process may be performed by the full-fledged BCH decoder.

Figure 4:
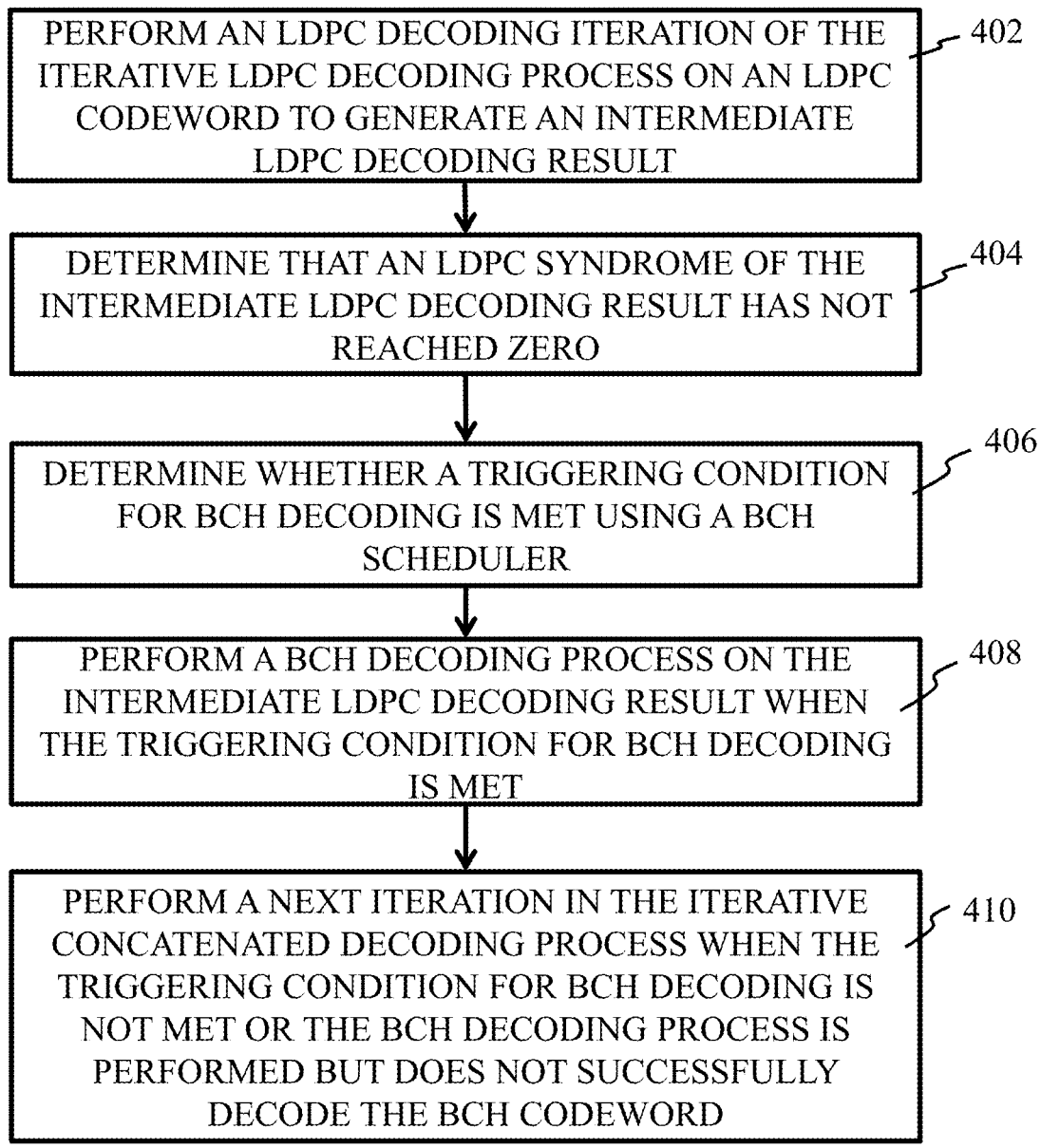
FIG. 4 schematically shows an iterative concatenated decoding process in accordance with an embodiment of the present disclosure.

FIG. 4 schematically shows an iterative concatenated decoding process 400 in accordance with an embodiment of the present disclosure. An iteration of the iterative concatenated decoding process 400 may start at block 402, in which an LDPC decoding iteration of the iterative LDPC decoding process may be performed on the LDPC codeword to generate an intermediate LDPC decoding result. In block 404, it may be determined that an LDPC syndrome of the intermediate LDPC decoding result has not reached zero. In block 406, it may be determined whether a triggering condition for BCH decoding is met using a BCH scheduler. In block 408, a BCH decoding process may be performed on the intermediate LDPC decoding result when the triggering condition for BCH decoding is met. For example, in embodiments that the BCH decoder 118 is a full-fledged BCH decoder, a full BCH decoding process (including BCH decoding and BCH syndrome calculation) may be performed by the BCH decoder 118.

In block 410, a next iteration in the iterative concatenated decoding process may be performed when the triggering condition for BCH decoding is not met or the BCH decoding process is performed but the BCH decoding is not successful. The iterative concatenated decoding process may continue to a next iteration if either one of two conditions are satisfied. One condition is that the triggering condition for activating the BCH decoder is not met, then the iterative concatenated decoding process may start the next LDPC iteration. Another condition is that the BCH decoder is activated but the BCH decoding is not successful. That is, the BCH decoder has not successfully decoded the BCH codeword, and thus the next iteration of the iterative concatenated decoding process is needed.

Figure 5:
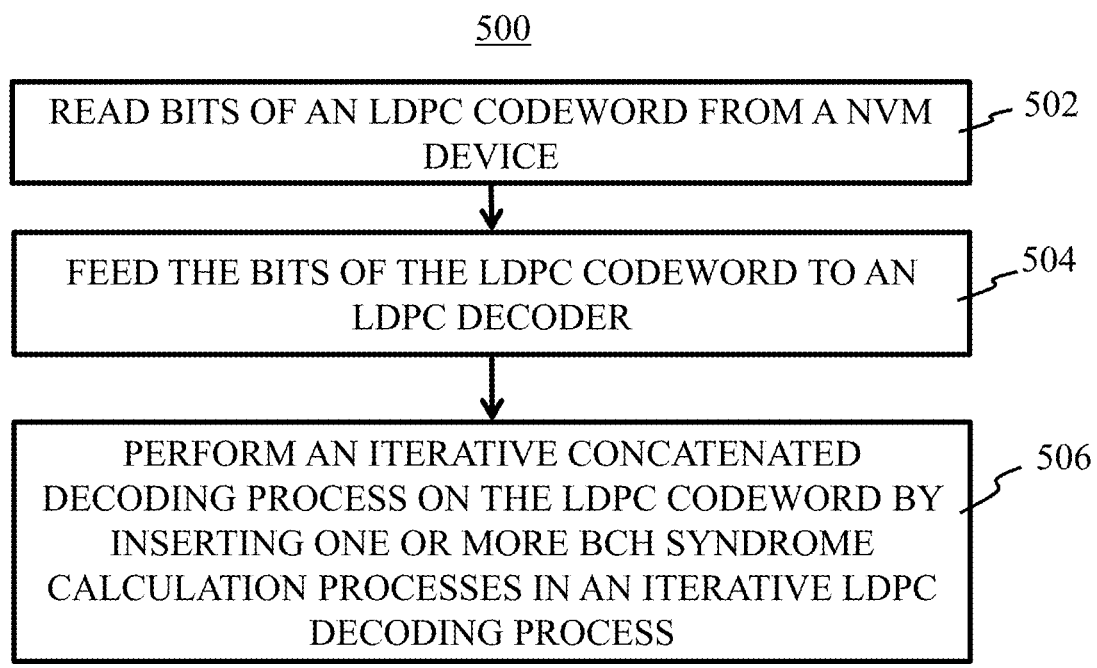
FIG. 5 is a flow diagram of a process for performing concatenated ECC in accordance with another embodiment of the present disclosure.

FIG. 5 is a flow diagram of a process 500 for performing a concatenated ECC decoding in accordance with another embodiment of the present disclosure. In block 502, bits of a Low-Density Parity-Check (LDPC) codeword may be read from a non-volatile storage device. These bits may be raw bits that contain errors. The LDPC codeword may be generated by LDPC encoding a Bose—Chaudhuri—Hocquenghem (BCH) codeword, and the BCH codeword may be generated by BCH encoding a data unit. In some embodiments, more than one BCH codewords may be encoded together by LDPC encoding to generate one LDPC codeword. In block 504, the bits of the LDPC codeword read from the non-volatile storage device may be fed to an LDPC decoder. For example, the LDPC decoder 114 may be fed the raw bits read from an NVM and start the LDPC decoding on these bits read from the NVM. In block 506, an iterative concatenated decoding process may be performed on the LDPC codeword. The LDPC decoder 114 may be configured to perform an iterative LDPC decoding process. In some embodiments, the BCH decoder 118 may be a simplified version that contains only a BCH syndrome calculator for BCH error detection and one or more BCH syndrome calculation processes may be inserted into the iterative LDPC decoding process. Each of the one or more BCH syndrome calculation processes may calculate BCH syndromes for BCH error detection.

Figure 6:
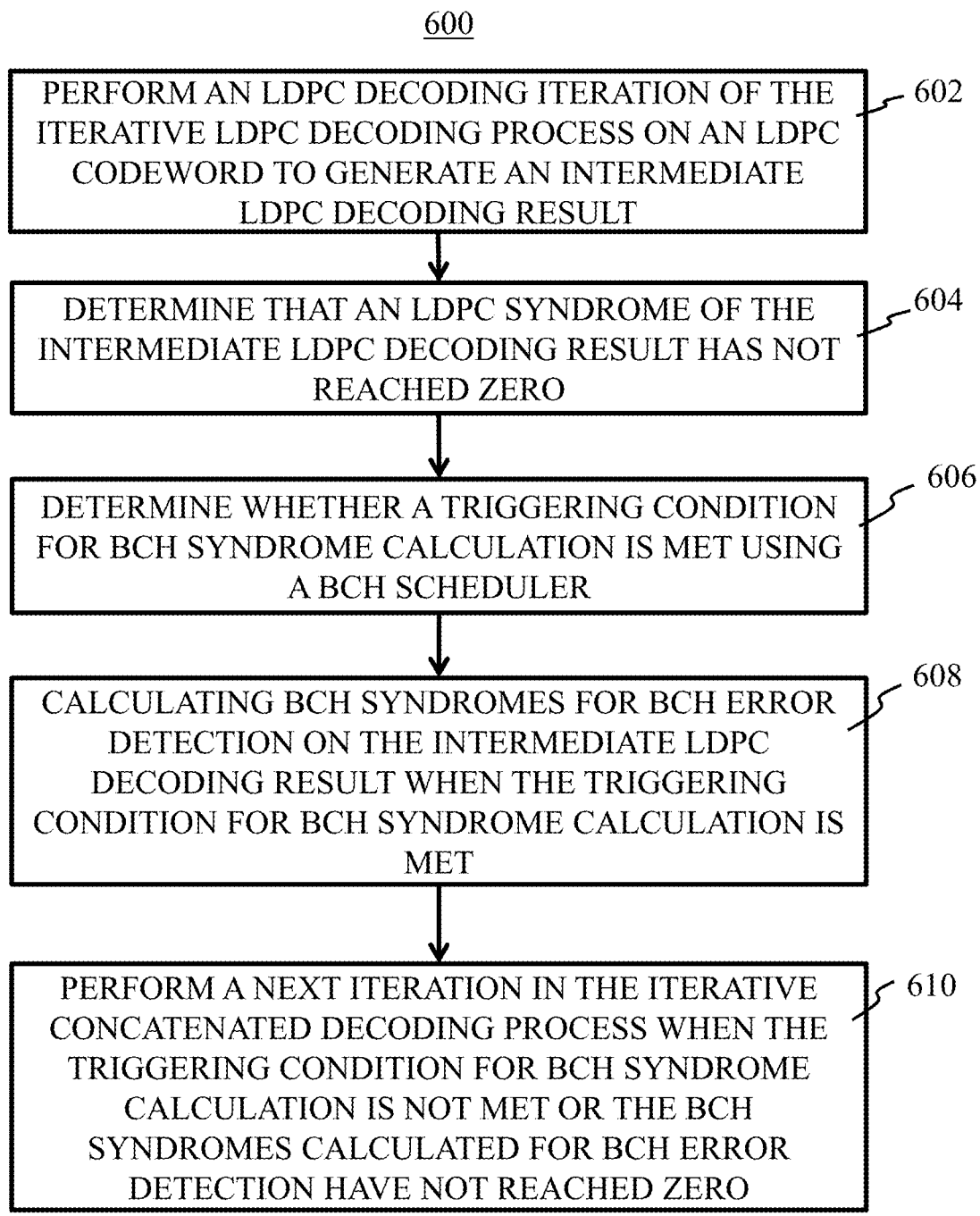
FIG. 6 schematically shows an iterative concatenated decoding process in accordance with another embodiment of the present disclosure.

FIG. 6 schematically shows an iterative concatenated decoding process 600 in accordance with an embodiment of the present disclosure. An iteration of the iterative concatenated decoding process 600 may start at block 602, in which an LDPC decoding iteration of the iterative LDPC decoding process may be performed on the LDPC codeword to generate an intermediate LDPC decoding result. In block 604, it may be determined that an LDPC syndrome of the intermediate LDPC decoding result has not reached zero. In block 606, it may be determined whether a triggering condition for BCH syndrome calculation is met using a BCH scheduler. In block 608, BCH syndromes may be calculated on the intermediate LDPC decoding result for BCH error detection when the triggering condition for BCH syndrome calculation is met. In embodiments that the BCH decoder 118 is a simplified version that contains a BCH syndrome calculator but no other BCH decoding circuits, the BCH syndrome calculator may calculate the BCH syndromes for BCH error detection.

In block 610, a next iteration in the iterative concatenated decoding process may be performed when the triggering condition for BCH syndrome calculation is not met or the BCH syndromes calculated for BCH error detection have not reached zero. The iterative concatenated decoding process may continue to a next iteration if either one of two conditions are satisfied. One condition is that the triggering condition for BCH syndrome calculation is not met, then the iterative concatenated decoding process may start the next LDPC iteration. Another condition is that the triggering condition for BCH syndrome calculation is met but the BCH syndromes calculated for BCH error detection have not reached zero. That is, after the LDPC decoding process, the data unit of the BCH codeword still contains error(s) and has not been successfully recovered, and thus the next iteration of the iterative concatenated decoding process is needed.

It should be noted that the first iteration may start with raw bits obtained from an NVM device but subsequent iterations may work on a previous decoding result. And if the BCH decoding process is performed, the next LDPC iteration may work on the decoding result generated by the BCH decoding process. A decoding success may be achieved whenever the LDPC syndrome reaches zero after an LDPC decoding iteration or the BCH syndromes reach zero (e.g., after a BCH decoding process or a BCH error detection). The iterative concatenated decoding process may have a predetermined maximum of iterations and a decoding failure may be declared the maximum number of iterations has reached.

In some embodiments, the LDPC decoder 114 may be an iterative decoder and the BCH decoding processes may be inserted between LDPC iterations. As long as the number of residual errors in the data part of an intermediate LDPC decoding result is smaller than the decoding capability of the BCH, the data part may be corrected by the BCH decoder, instead of waiting for the LDPC decoder continue the LDPC decoding process. By introducing BCH error decoding into the iteration of the LDPC decoder, the convergence speed of the LDPC decoder may be improved. In contrast, if the BCH decoder does not get activated early, either the LDPC decoder can correct these residual errors in a future iteration or the LDPC decoder cannot fix these errors after a pre-set maximum number of iterations. In both situations, the decoding process may introduce a longer latency. Therefore, embodiments according to the present disclosure may obtain a decoding success earlier than conventional decoding process, and the decoding procedure may be terminated as soon as possible.

In an exemplary embodiment, there is provided a method that may comprise reading bits of a Low-Density Parity-Check (LDPC) codeword from a non-volatile storage device, feeding the bits of the LDPC codeword read from the non-volatile storage device to an LDPC decoder, and performing an iterative concatenated decoding process on the LDPC codeword by inserting one or more Bose—Chaudhuri—Hocquenghem (BCH) decoding processes in an iterative LDPC decoding process. The LDPC codeword may be generated by BCH encoding a codeword, and the BCH codeword may be generated by BCH encoding a data unit. An iteration of the iterative concatenated decoding process may include: performing an LDPC decoding iteration of the iterative LDPC decoding process on the LDPC codeword to generate an intermediate LDPC decoding result, determining an LDPC syndrome of the intermediate LDPC decoding result has not reached zero, determining whether a triggering condition for BCH decoding is met using a BCH scheduler, performing a BCH decoding process on the intermediate LDPC decoding result when the triggering condition for BCH decoding is met and performing a next iteration in the iterative concatenated decoding process when the triggering condition for BCH decoding is not met or the BCH decoding process is performed but does not successfully decode the BCH codeword.

In one embodiment, the triggering condition for BCH decoding is that a number of flipped bits in the LDPC decoding iteration is zero and the LDPC syndrome is larger than zero.

In one embodiment, the triggering condition for BCH decoding is that the LDPC syndrome is smaller than a predefined threshold.

In one embodiment, the triggering condition for BCH decoding is that a number of flipped bits in the LDPC decoding iteration and a number of flipped bits in a previous LDPC decoding iteration are both smaller than a threshold.

In one embodiment, the triggering condition for BCH decoding is that a current iteration number has reached a predefined threshold.

In one embodiment, inputs to the BCH scheduler may include one or more of: an LDPC iteration number, an LDPC column index, an LDPC layer index, the LDPC syndrome, a number of flipped bits in the LDPC decoding iteration, and a number of flipped bits in a previous LDPC decoding iteration.

In one embodiment, the iterative LDPC decoding process may be a hard decision decoding process or a soft decision decoding process.

In another exemplary embodiment, there is provided another method that may comprise: reading bits of a Low-Density Parity-Check (LDPC) codeword from a non-volatile storage device, feeding the bits of the LDPC codeword read from the non-volatile storage device to an LDPC decoder and performing an iterative concatenated decoding process on the LDPC codeword by inserting one or more Bose—Chaudhuri—Hocquenghem (BCH) syndrome calculation processes in an iterative LDPC decoding process. The LDPC codeword may be generated by BCH encoding a codeword, and the BCH codeword may be generated by BCH encoding a data unit. An iteration of the iterative concatenated decoding process may include: performing an LDPC decoding iteration of the iterative LDPC decoding process on the LDPC codeword to generate an intermediate LDPC decoding result, determining an LDPC syndrome of the intermediate LDPC decoding result has not reached zero, determining whether a triggering condition for BCH syndrome calculation is met using a BCH scheduler, calculating BCH syndromes for BCH error detection on the intermediate LDPC decoding result when the triggering condition for BCH syndrome calculation is met, and performing a next iteration in the iterative concatenated decoding process when the triggering condition for BCH syndrome calculation is not met or the BCH syndromes have not reached zero.

In one embodiment, the triggering condition for BCH syndrome calculation is that a number of flipped bits in the LDPC decoding iteration is zero and the LDPC syndrome is larger than zero.

In one embodiment, the triggering condition for BCH syndrome calculation is that the LDPC syndrome is smaller than a predefined threshold.

In one embodiment, the triggering condition for BCH syndrome calculation is that a number of flipped bits in the LDPC decoding iteration and a number of flipped bits in a previous LDPC decoding iteration are both smaller than a threshold.

In one embodiment, the triggering condition for BCH syndrome calculation is that a current iteration number has reached a predefined threshold.

In one embodiment, inputs to the BCH scheduler include one or more of: an LDPC iteration number, an LDPC column index, an LDPC layer index, the LDPC syndrome, a number of flipped bits in the LDPC decoding iteration, and a number of flipped bits in a previous LDPC decoding iteration.

In yet another exemplary embodiment, there is provided an apparatus that may comprise: a Low-Density Parity-Check (LDPC) decoder configured to perform an iterative LDPC decoding process on bits of an LDPC codeword, a Bose—Chaudhuri—Hocquenghem (BCH) decoder coupled to the LDPC decoder, and a BCH scheduler coupled to the LDPC decoder and the BCH decoder. The LDPC codeword may be generated by LDPC encoding a Bose—Chaudhuri—Hocquenghem (BCH) codeword, and the BCH codeword may be generated by BCH encoding a data unit. The BCH scheduler may be configured to determine whether a triggering condition for the BCH decoder is met after each iteration of the iterative LDPC decoding process and activate the BCH decoder to operate on an intermediate decoding result of the LDPC decoder if the triggering condition for the BCH decoder is met.

In one embodiment, the BCH decoder may be a simplified decoder that contains a BCH error detector configured to calculate BCH syndromes on the decoding result of the LDPC decoder.

In one embodiment, the triggering condition for the BCH decoder is that a number of flipped bits in a current LDPC decoding iteration is zero and an LDPC syndrome after the current LDPC decoding iteration is larger than zero.

In one embodiment, the triggering condition for the BCH decoder is that an LDPC syndrome after a current LDPC decoding iteration is smaller than a predefined threshold.

In one embodiment, the triggering condition for the BCH decoder is that a number of flipped bits in a current LDPC decoding iteration and a number of flipped bits in a previous LDPC decoding iteration are both smaller than a threshold.

In one embodiment, the triggering condition for the BCH decoder is that a current iteration number has reached a predefined threshold.

In one embodiment, inputs to the BCH scheduler include one or more of: an LDPC iteration number, an LDPC column index, an LDPC layer index, an LDPC syndrome weight, a number of flipped bits in a current LDPC decoding iteration, and a number of flipped bits in a previous LDPC decoding iteration.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   reading bits of a Low-Density Parity-Check (LDPC) codeword from a non-volatile storage device, the LDPC codeword being generated by LDPC encoding a Bose—Chaudhuri—Hocquenghem (BCH) codeword, the BCH codeword being generated by BCH encoding a data unit;
   feeding the bits of the LDPC codeword read from the non-volatile storage device to an LDPC decoder; and
   performing an iterative concatenated decoding process on the LDPC codeword by inserting one or more BCH decoding processes in an iterative LDPC decoding process, an iteration of the iterative concatenated decoding process including:
      performing an LDPC decoding iteration of the iterative LDPC decoding process on the LDPC codeword to generate an intermediate LDPC decoding result;
      determining an LDPC syndrome of the intermediate LDPC decoding result has not reached zero;
      determining whether a triggering condition for BCH decoding is met using a BCH scheduler, wherein the triggering condition for BCH decoding is based on status information of the LDPC decoding process;
      performing a BCH decoding process on the intermediate LDPC decoding result when the triggering condition for BCH decoding is met; and
      performing a next iteration in the iterative concatenated decoding process when the triggering condition for BCH decoding is not met or the BCH decoding process is performed but does not successfully decode the BCH codeword;
   wherein the triggering condition for BCH decoding is that a number of flipped bits in the LDPC decoding iteration is zero and the LDPC syndrome is larger than zero or that a number of flipped bits in the LDPC decoding iteration and a number of flipped bits in a previous LDPC decoding iteration are both smaller than a threshold.

2. The method of claim 1, wherein the triggering condition for BCH decoding is that the LDPC syndrome is smaller than a predefined threshold.

3. The method of claim 1, wherein the triggering condition for BCH decoding is that a current iteration number has reached a predefined threshold.

4. The method of claim 1, wherein inputs to the BCH scheduler include one or more of: an LDPC iteration number, an LDPC column index, an LDPC layer index, the LDPC syndrome, a number of flipped bits in the LDPC decoding iteration, and a number of flipped bits in a previous LDPC decoding iteration.

5. The method of claim 1, wherein the iterative LDPC decoding process is a hard decision decoding process or a soft decision decoding process.

6. An apparatus, comprising:
   a Low-Density Parity-Check (LDPC) decoder configured to perform an iterative LDPC decoding process on bits of an LDPC codeword, the LDPC codeword being generated by LDPC encoding a Bose—Chaudhuri—Hocquenghem (BCH) codeword, the BCH codeword being generated by BCH encoding a data unit;
   a Bose—Chaudhuri—Hocquenghem (BCH) decoder coupled to the LDPC decoder; and
   a BCH scheduler coupled to the LDPC decoder and the BCH decoder, wherein the BCH scheduler is configured to determine whether a triggering condition for the BCH decoder is met after each iteration of the iterative LDPC decoding process and activate the BCH decoder to operate on an intermediate decoding result of the LDPC decoder if the triggering condition for the BCH decoder is met, wherein the triggering condition for the BCH decoder is based on status information of the LDPC decoding process;
   wherein the triggering condition for the BCH decoder is that a number of flipped bits in a current LDPC decoding iteration is zero and an LDPC syndrome after the current LDPC decoding iteration is larger than zero or that a number of flipped bits in a current LDPC decoding iteration and a number of flipped bits in a previous LDPC decoding iteration are both smaller than a threshold.

7. The apparatus of claim 6, wherein the BCH decoder is a simplified decoder that contains a BCH error detector configured to calculate BCH syndromes on the decoding result of the LDPC decoder.

8. The apparatus of claim 6, wherein the triggering condition for the BCH decoder is that an LDPC syndrome after a current LDPC decoding iteration is smaller than a predefined threshold.

9. The apparatus of claim 6, wherein the triggering condition for the BCH decoder is that a current iteration number has reached a predefined threshold.

10. The apparatus of claim 6, wherein inputs to the BCH scheduler include one or more of: an LDPC iteration number, an LDPC column index, an LDPC layer index, an LDPC syndrome weight, a number of flipped bits in a current LDPC decoding iteration, and a number of flipped bits in a previous LDPC decoding iteration.

* * * * *